(12) United States Patent
Kurakata

(10) Patent No.: US 7,820,355 B2
(45) Date of Patent: Oct. 26, 2010

(54) RADIATION SENSITIVE RESIN COMPOSITION

(75) Inventor: Hiroshi Kurakata, Yokohama (JP)

(73) Assignee: Zeon Corporation, Tokyo (JP)

( * ) Notice: Subject to any disclaimer, the term of this patent is extended or adjusted under 35 U.S.C. 154(b) by 130 days.

(21) Appl. No.: 10/534,459

(22) PCT Filed: Nov. 19, 2003

(86) PCT No.: PCT/JP03/14764

§ 371 (c)(1),
(2), (4) Date: May 11, 2005

(87) PCT Pub. No.: WO2004/051374

PCT Pub. Date: Jun. 17, 2004

(65) Prior Publication Data

US 2006/0040201 A1    Feb. 23, 2006

(30) Foreign Application Priority Data

Nov. 29, 2002    (JP)    ............... 2002-347224

(51) Int. Cl.
G03F 7/004 (2006.01)
G03F 7/028 (2006.01)

(52) U.S. Cl. .................... 430/270.1; 430/326

(58) Field of Classification Search ........... 430/170, 430/270.1, 326, 327, 330; 525/328.8, 339; 526/90, 281, 259, 286, 171
See application file for complete search history.

(56) References Cited

U.S. PATENT DOCUMENTS

| | | | |
|---|---|---|---|
| 5,350,660 A | | 9/1994 | Urano et al. |
| 5,721,990 A * | | 2/1998 | Akaiwa et al. ............. 396/310 |
| 6,147,177 A * | | 11/2000 | Jayaraman et al. ........ 526/281 |
| 6,245,485 B1 * | | 6/2001 | Aoai et al. ............... 430/288.1 |
| 6,372,403 B1 | | 4/2002 | Kurisaki et al. |
| 6,372,854 B1 | | 4/2002 | Sunaga et al. |
| 6,451,499 B1 * | | 9/2002 | Jayaraman et al. ....... 430/270.1 |
| 6,486,264 B1 * | | 11/2002 | Tsunogae et al. ........... 525/339 |
| 6,692,887 B1 * | | 2/2004 | Suwa et al. ............. 430/270.1 |
| 6,696,219 B2 * | | 2/2004 | Yasunami et al. ........ 430/271.1 |
| 6,727,032 B1 * | | 4/2004 | Suwa et al. ............... 430/170 |
| 6,790,582 B1 * | | 9/2004 | Eilbeck ..................... 430/190 |
| 2002/0001772 A1 | | 1/2002 | Nishi et al. |
| 2002/0012880 A1 * | | 1/2002 | Imai et al. ............... 430/284.1 |
| 2002/0128408 A1 * | | 9/2002 | Goodall et al. ............. 526/171 |
| 2002/0150825 A1 * | | 10/2002 | Watanabe et al. ............. 430/5 |
| 2003/0195357 A1 | | 10/2003 | Stuer et al. |
| 2004/0152843 A1 * | | 8/2004 | Taguchi et al. ........... 525/328.8 |

FOREIGN PATENT DOCUMENTS

| | | |
|---|---|---|
| CN | 1291302 A | 4/2001 |
| EP | 0 440 374 A2 | 8/1991 |
| JP | 7-2929 A | 1/1995 |
| JP | 7-149823 A | 6/1995 |
| JP | 10-307388 A | 11/1998 |
| JP | 11-52574 A | 2/1999 |
| JP | 11-158256 A | 6/1999 |
| JP | 11-193323 A | 7/1999 |
| JP | 11-209460 A | 8/1999 |
| JP | 11-327144 A | 11/1999 |
| JP | 3090991 B2 | 7/2000 |
| WO | WO 99/42502 A1 | 8/1999 |
| WO | WO 00/73366 | * 12/2000 |
| WO | WO-02/14336 A1 | 2/2002 |

* cited by examiner

Primary Examiner—Cynthia H Kelly
Assistant Examiner—Anca Eoff
(74) Attorney, Agent, or Firm—Birch, Stewart, Kolasch & Birch, LLP

(57) ABSTRACT

A radiation sensitive resin composition which contains an alicyclic olefin resin obtained by ring-opening polymerization of a polymerizable monomer containing an alicyclic olefin monomer having carboxyl group using a ruthenium catalyst, followed by hydrogenation, an acid-generating agent, a crosslinking agent and a solvent; and a transparent resin pattern film formed on a substrate obtained by laminating a resin film formed by using the resin composition described above to the substrate, followed by irradiation with an active radiation to form a latent pattern and developing the pattern by bringing the resin film having the latent pattern into contact with a developing solution. The resin composition exhibits excellent property for development and storage stability. The transparent resin pattern film obtained from the resin composition exhibits excellent specific permittivity, transparency, dimensional stability under heating, solvent resistance and flatness and can be utilized as the resin film for electronic parts.

17 Claims, No Drawings

RADIATION SENSITIVE RESIN COMPOSITION

TECHNICAL FIELD

The present invention relates to a radiation sensitive resin composition solubility of which in a developing solution changes by irradiation with an active radiation such as particle beams and electronic beams. More particularly, the present invention relates to a radiation sensitive resin composition advantageously used as the material for forming a resin pattern film having excellent transparency which is used as a resin film for electronic parts such as the protective film, the flattening film and the electric insulation film.

BACKGROUND ART

In electronic parts such as liquid crystal display devices, integrated circuit devices and solid image forming devices and color filters for liquid crystal displays, functional resin films for electronic parts such as protective films for preventing degradation and damages of devices and displays, flattening films for flattening the surface of the devices and wiring and electric insulation films for maintaining the electric insulation are disposed. In liquid crystal display devices of the thin film transistor type and integrated circuit devices, interlayer insulation films for insulation between wirings arranged as layers are disposed as the functional resin films for electronic parts.

However, occasionally, an interlayer insulation film having sufficient flatness cannot be formed even when a thermosetting material heretofore known as the material for forming electronic parts is used, and a novel material sensitive to radiation which is used for forming insulation films and enables fine patterns to be formed has been desired. Moreover, as the density of the wiring and the devices increases recently, the desired material is required to have a small permittivity.

In response to the above requirement, compositions comprising an alicyclic olefin resin soluble in an alkali which is obtained by ring-opening polymerization of a norbornene-based monomer having an ester group, followed by hydrogenation of the obtained polymer and hydrolysis of the ester group portion to form bonded carboxylic group, an acid-generating agent and a crosslinking agent, are proposed (Japanese Patent Application Laid-Open Nos. Heisei 10(1998)-307388 and Heisei 11(1999)-52574).

However, it has been confirmed by the present inventors that the resin films formed by using the radiation sensitive resin compositions described in the above two patent publications have poor storage stability and property for development although permittivity, water absorption, flatness, solvent resistance and dimensional stability under heating are excellent. Since a radiation sensitive resin composition is used in an industrial process, in general, after the composition is prepared in a suitable vessel and, then, transferred to an apparatus for applying to a substrate or the like, the storage stability of the composition is very important.

As the result of intensive studies based on the above knowledge by the present inventors to obtain a radiation sensitive resin composition which is suitable for industrial process, it was found that an alicyclic olefin resin soluble in an alkali could be obtained without the hydrolysis step when an alicyclic olefin monomer having an acidic group such as carboxyl group was polymerized in the presence of a catalyst containing ruthenium (a ruthenium catalyst) and the obtained polymer was hydrogenated in place of obtaining, as specifically described in examples of the above publications, an alicyclic olefin resin by ring-opening polymerization of an alicyclic olefin monomer having an alkyloxycarbonyl group in the presence of a catalyst containing tungsten (a tungsten catalyst), followed by hydrogenation of the obtained polymer and hydrolysis of the hydrogenation product to obtain carboxylic acid, and that the resin obtained by the present inventors exhibited the storage stability suitable for the industrial process and provided a radiation sensitive resin composition exhibiting an improved property for development. The present invention has been completed based on the above knowledge.

Patent Reference 1

Japanese Patent Application Laid-Open No. Heisei 10(1998)-307388

Patent Reference 2

Japanese Patent Application Laid-Open No. Heisei 11(1999)-52574

DISCLOSURE OF THE INVENTION

In accordance with the present invention, a radiation sensitive resin composition which comprises (A) an alicyclic olefin resin soluble in an alkali, (B) an acid-generating agent, (C) a crosslinking agent and (D) a solvent is provided. In the composition, the alicyclic resin soluble in an alkali is a ring-opening polymer having an acidic group which is obtained by ring-opening polymerization of a polymerizable monomer comprising an alicyclic olefin monomer having an acidic group in the presence of a catalyst comprising ruthenium, followed by hydrogenating the obtained polymer.

In accordance with the present invention, a process for forming a resin pattern film on a substrate which comprises laminating a resin film formed by using the resin composition described above to the substrate, irradiating the resin film with an active radiation to form a latent pattern in the resin film and developing a pattern by bringing the resin film having the latent pattern into contact with a developing solution, is also provided.

In accordance with the present invention, a transparent resin pattern film formed in accordance with the process described above and an electric insulation film comprising the resin pattern film described above are also provided.

Specifically, the present invention provides:

(1) A radiation sensitive resin composition which comprises (A) an alicyclic olefin resin soluble in an alkali, (B) an acid-generating agent, (C) a crosslinking agent and (D) a solvent, wherein the alicyclic resin soluble in an alkali is a ring-opening polymer having an acidic group which is obtained by ring-opening polymerization of a polymerizable monomer comprising an alicyclic olefin monomer having an acidic group in a presence of a catalyst comprising ruthenium, followed by hydrogenating an obtained polymer;

(2) A radiation sensitive resin composition described in (1), wherein the acidic group is carboxyl group or phenolic hydroxyl group;

(3) A radiation sensitive resin composition described in (1), wherein the alicyclic olefin monomer having an acidic group is an alicyclic olefin monomer represented by following formula (1):

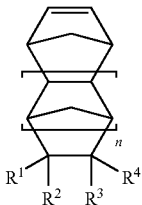

(1)

wherein $R^1$ to $R^4$ each independently represent hydrogen atom or a group represented by —$X_m$—R', X representing a divalent group, m representing 0 or 1, and R' representing an alkyl group having 1 to 7 carbon atoms which may have substituents, an aromatic group or an acidic group; at least one of $R^1$ to $R^4$ represents a group represented by —$X_m$—R' in which R' represents an acidic group; and n represents an integer of 0 to 2;

(4) A radiation sensitive resin composition described in (1), wherein the catalyst comprising ruthenium is a catalyst comprising as a main component an organoruthenium compound in which a neutral electron-donating ligand is coordinated;

(5) A radiation sensitive resin composition described in (4), wherein the neutral electron-donating ligand is a heterocyclic carbene compound having nitrogen atom;

(6) A radiation sensitive resin composition described in (1), wherein the polymerizable monomer further comprises an alicyclic olefin monomer in which a group having an aromatic group and an aprotic polar group are bonded;

(7) A process for forming a resin pattern film on a substrate which comprises laminating a resin film comprising a radiation sensitive resin composition described in any one of (1) to (6) to the substrate, irradiating the resin film with an active radiation to form a latent pattern in the resin film and developing a pattern by bringing the resin film having the latent pattern into contact with a developing solution;

(8) A transparent resin pattern film formed in accordance with a process described in (7); and (9) A resin film for electronic parts comprising a resin pattern film described in (8).

THE MOST PREFERRED EMBODIMENT TO CARRY OUT THE INVENTION

The alicyclic olefin resin soluble in an alkali of component (A) used in the radiation sensitive resin composition of the present invention is an ring-opening polymer obtained by polymerizing an alicyclic olefin monomer (an unsaturated aliphatic cyclic hydrocarbon) having an acidic group in the presence of a catalyst comprising ruthenium, followed by hydrogenating the obtained polymer. Since the ring-opening polymer has an acidic group, the polymer is soluble in an alkaline solution. The acidic group is a group forming a Brønsted acid, examples of which include carboxyl group and phenolic hydroxyl group (hydroxyphenyl group).

In the present invention, one or more polymerizable monomers other than the alicyclic olefin monomer having an acidic group (referred to as other monomers, hereinafter) can be used.

The fraction of the alicyclic olefin monomer having an acidic group in the entire polymerizable monomers used for obtaining the alicyclic olefin resin soluble in an alkali of component (A) is, in general, 10 to 100% by mole, preferably 15 to 90% by mole, more preferably 20 to 80% by mole and most preferably 25 to 70% by mole. The fraction in this range is advantageous since the balance between the transparency, the resistance to discoloration under heating and the property for development is excellent.

The number of the acidic group in the alicyclic olefin monomer is not particularly limited. It is preferable that the number of the acidic group is 1 or 2. When a compound having two or more acidic groups in the molecule is used as the alicyclic olefin monomer having an acidic group, the property for achieving excellent patterning can be obtained even when the above fraction is relatively small within the above range (specifically, in general, 10 to 50% by mole, preferably 20 to 40% by mole and more preferably 25 to 35% by mole). In contrast, when a compound having just one acidic group in the molecule is used as the alicyclic olefin monomer having an acidic group, it is preferable that the above fraction is set at a relatively great value within the above range (specifically, in general, 50 to 90% by mole, preferably 55 to 80% by mole and more preferably 60 to 75% by mole).

The alicyclic olefin monomer having an acidic group may have other groups showing no acidity such as aromatic groups, alcoholic hydroxyl group and carbonyl group in combination with the acidic group.

Preferable examples of the alicyclic olefin monomer having an acidic group include compounds represented by the following formula (1):

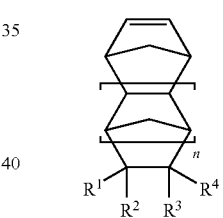

(1)

(In the above formula, $R^1$ to $R^4$ each independently represent hydrogen atom or a group represented by —$X_m$—R', X representing a divalent group, m representing 0 or 1, and R' representing an alkyl group having 1 to 7 carbon atoms which may have substituents, an aromatic group or an acidic group; at least one of $R^1$ to $R^4$ represents a groups represented by —$X_m$—R' in which R' represents an acidic group; and n represents an integer of 0 to 2.)

In formula (1), $R^1$ to $R^4$ each independently represent hydrogen atom or a group represented by —$X_m$—R' (X representing a divalent group, m representing 0 or 1, and R' representing an alkyl group having 1 to 7 carbon atoms which may have substituents, an aromatic group or an acidic group); and at least one, preferably one or two, of $R^1$ to $R^4$ represent groups represented by —$X_m$—R' in which R' represents an acidic group. It is more preferable that one or two of $R^1$ to $R^4$ represent groups represented by —$X_m$—R' in which R' represents an acidic group, and the rest of $R^1$ to $R^4$ represent hydrogen atom. When any two of $R^1$ to $R^4$ represent groups represented by —$X_m$—R' in which R' represents an acidic group, it is preferable that the two such groups are groups bonded to different carbon atoms (for example, the combination of groups represented by $R^1$ and $R^3$).

In formula (1), X represents a divalent group. Examples of the divalent group include alkylene groups, arylene groups and —O—, —R—C(=O)—R— (R representing an alkylene group or an arylene group). From the standpoint of the stability, alkylene groups and arylene groups are preferable.

In formula (1), m represents 0 or 1 and, preferably, 0 from the standpoint of the productivity.

The alkyl group is a linear, branched or cyclic saturated hydrocarbon group having 1 to 7 carbon atoms. Examples of the alkyl group include methyl group, ethyl group, n-propyl group, isopropyl group, cyclopropyl group, n-butyl group, isobutyl group, t-butyl group, s-butyl group, cyclobutyl group, n-pentyl group, 1-methybutyl group, 2-methylbutyl group, isopentyl group, cyclopentyl group, n-hexyl group, 1-methypentyl group, 2-methylpentyl group, 2-ethylbutyl group, 3-methylpentyl group, isohexyl group, cyclohexyl group, 1-methylcyclopentyl group, n-heptyl group, 1-methylhexyl group, 2-methylhexyl group, 3-methylhexyl group, 2-ethyl-3-methylbutyl group, isoheptyl group, cycloheptyl group and 3-methylcyclohexyl group.

The above alkyl group may have a substituent such as halogen atoms, hydroxyl group (alcoholic hydroxyl group), —C(=O)—R, —OR, —C(=O)—O—R and —OC(=O)—R(R in these formulae representing an alkyl group or an aryl group).

The other monomer which can be used as the polymerizable monomer may be an alicyclic olefin monomer (having no acidic groups) or a monomer which is not alicyclic (unsaturated aliphatic chain hydrocarbon) such as ethylene. From the standpoint of the heat resistance, the amount of the monomer which is not alicyclic is, in general, 50% by mole or less, preferably 40% by mole or less, more preferably 30% by mole and most preferably 20% by mole or less based on the amount of the entire polymerizable monomers.

Preferable examples of the other monomer include alicyclic olefin monomers having a group having an aromatic group and an aprotic polar group, alicyclic olefin monomers having no polar groups and alicyclic olefin monomers having no aromatic groups but having an aprotic polar group. Examples of the aromatic group include phenyl group, naphthyl group, anthracenyl group and phenanthrene group. Phenyl group is preferable due to the excellent sensitivity. Hydrogen atoms in the aromatic group may be substituted with other atoms such as halogen atoms or organic groups such as alkyl groups.

It is sufficient that the aprotic polar group is a monovalent or multivalent aprotic group of atoms containing a heteroatom having a noncovalent electron pair such as oxygen atom, nitrogen atom and sulfur atom. Examples of the aprotic polar group include N,N-disubstituted amino groups, carbonyl group, carbonyloxycarbonyl group, oxycarbonyl group, ether group, thioether group, N-substituted amide groups and N-substituted imide groups.

Preferable examples of the group having an aromatic group and an aprotic polar group include N-phenyl substituted imide groups such as N-phenyldicarboxyimide group; N-phenyl substituted amide groups such as N-phenylamide group; and phenyl ester groups such as phenoxycarbonyl group and methoxycarbonyloxyphenyl group. More preferable examples of the group having an aromatic group and an aprotic polar group include N-phenyldicarboxyimide group.

The alicyclic olefin monomer having no polar groups may have nonpolar groups. Examples of the nonpolar group include aromatic hydrocarbon groups such as phenyl group and aliphatic hydrocarbon groups such as methyl group, ethyl group, isopropyl group and cyclohexyl group.

Examples of the polymerizable monomer used for obtaining the alicyclic olefin resin of component (A) used in the present invention will be described later.

The alicyclic olefin resin of component (A) used in the present invention is obtained by ring-opening polymerization of polymerizable monomers such as the alicyclic olefin monomer having an acidic group and other monomers used where necessary in the presence of the ruthenium catalyst, followed by hydrogenation of the obtained polymer (hydrogenation of the double bond in the main chain).

The ruthenium catalyst used in the present invention is a catalyst comprising ruthenium which accelerates the polymerization and is, preferably, a catalyst comprising as the main component an organoruthenium compound in which a neutral electron-donating ligand is coordinated. The neutral electron-donating ligand in the organoruthenium compound is a ligand having the neutral charge when the ligand is separated from the central atom, i.e., ruthenium.

In the preferable organoruthenium compound used in the present invention, an anionic ligand is coordinated. The anionic ligand is a ligand having a negative charge when the ligand is separated from ruthenium. A counter ion may further be present in the organoruthenium compound. The counter ion is an anion forming an ion pair with the ruthenium cation and is not particularly limited as long as the anion can from the above pair.

Typical examples of the organoruthenium compound advantageously used in the present invention include compounds represented by the following formula (2):

$$[(L^2)_c(Y^2)_d Ru\!=\!(C\!=\!)_e CQ_2]_y \qquad (2)$$

(In the above formula (2), a plurality of $L^2$ each independently represent a neutral electron-donating ligand, a plurality of $Y^2$ each independently represent an anionic ligand, a plurality of Q each independently represent hydrogen atom or a hydrocarbon group having 1 to 20 carbon atoms which may have halogen atoms, nitrogen atom, oxygen atom, silicon atom, phosphorus atom or sulfur atom, c, d and y each independently represent an integer of 1 to 4, and e represents 0 or 1.)

Examples of the neutral electron-donating ligand include oxygen atom, water, carbonyls, amines, pyridines, ethers, nitrites, esters, phosphines, phosphinites, phosphites, stibines, sulfoxides, thioethers, amides, aromatic compounds, diolefins which may be cyclic, olefins which may be cyclic, isocyanides, thiocyanates and heterocyclic carbene compounds having nitrogen atom. The polymerization activity is occasionally enhanced when, among the above ligands, a pyridine such as bipyridine; a phosphine such as triphenylphosphine and tricyclohexylphosphine; an aromatic compound such as p-cymene; a cyclic diolefin such as cyclopentadiene; or a heterocyclic carbene compound having nitrogen atom such as 1,3-dimesitylimidazolin-2-ylidene and 1,3-dimesitylimidazolidin-2-ylidene; is coordinated.

Examples of the anionic ligand include halogen atoms such as F, Br, Cl and I; hydrides, diketonate groups such as acetylacetonate group, cyclopentadienyl group, allyl group, alkenyl groups, alkyl groups, aryl groups, alkoxyl groups, aryloxyl groups, alkoxycarbonyl groups, arylcarboxyl groups, carboxyl group, alkyl- and arylsulfonyl groups, alkylthio groups, alkenylthio groups, arylthio groups, alkylsulfonyl groups and alkylsufinyl groups. The polymerization activity is excellent when, among the above ligands, a halogen atoms, cyclopentadienyl group, allyl group, an alkyl group or an aryl group is coordinated.

Examples of the atom or the group represented by Q in the above formula (2) include hydrogen atom, alkenyl groups, alkynyl groups, alkyl groups, alkylidene groups, aryl groups, carboxyl group, alkoxyl groups, alkenyloxyl groups, alkynyloxyl groups, aryloxyl groups, alkoxycarbonyl groups, alkylthio groups, alkenylthio groups, arylthio groups, alkylsulfonyl groups and alkylsulfinyl groups. The polymerization activity is occasionally enhanced when, among the above atom or the groups, an alkyl group, an alkylidene group, an aryl group, an alkoxyl group, an aryloxyl group, an alkylthio group or an arylthio group having 1 to 100 carbon atoms is coordinated.

Examples of the polymerization catalyst represented by formula (2) include bis(tricyclohexylphosphine)benzylideneruthenium dichloride, bis(triphenylphosphine)-3,3-diphenylpropenylideneruthenium dichloride, bis(tricyclohexylphosphine)phenylvinylideneruthenium dichloride, bis(tricyclohexylphosphine)-t-butylvinylideneruthenium dichloride, bis(1,3-diisopropylimidazolin-2-ylidene)benzylideneruthenium dichloride, bis(1,3-dicyclohexylimidazolin-2-ylidene)benzylideneruthenium dichloride, (1,3-dimesitylimidazolin-2-ylidne) (tricyclohexylphosphine) benzylideneruthenium dichloride and (1,3-dimesitylimidazolidin-2-ylidene)-(tricyclohexylphosphine) benzylideneruthenium dichloride.

For enhancing the polymerization activity of the above polymerization catalyst, a neutral electron-donating compound may be added in an amount by weight 1 to 100 times as much as the amount by weight of the ruthenium metal. Examples of the neutral electron-donating compound include pyridines, phosphines and heterocyclic carbene compounds having nitrogen atom described above such as 1,3-diisopropoylimidazolin-2-ylidene and 1,3-dimesitylimidazolidin-2-ylidene.

When the polymerization catalyst represented by formula (2) is used, for example, a diazo compound such as $N_2CHCOOEt$, an acetylene compound such as phenylacetylene or a silyl compound such as $Et_2SiH$ and $Ph_2MeSiH$ may be added in an amount by weight 1 to 100 times as much as the amount by weight of ruthenium metal to enhance the polymerization activity. In the above, Et means ethyl group, Ph means phenyl group, and Me means methyl group.

The ring-opening polymerization may be conducted in a solvent or without using solvents. It is preferable that the polymerization is conducted in a solvent since the hydrogenation can be conducted without isolating the polymer after the polymerization. The solvent used for the polymerization is not particularly limited as long as the polymerizable monomer is dissolved and the polymerization is not adversely affected. Examples of the solvent include aliphatic hydrocarbons such as pentane, hexane and heptane; alicyclic hydrocarbons such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindenecyclohexane and cyclooctane; aromatic hydrocarbons such as benzene, toluene, xylene and misitylene; hydrocarbons having nitrogen atom such as nitromethane, nitrobenzene, acetonitrile, propionitrile and benzonitrile; ethers such as diethyl ether, tetrahydrofuran and dioxane; and hydrocarbons having halogen atoms such as chloroform, dichloromethane, 1,2-dichloroethane, chlorobenzene, dichlorobenzene and trichlorobenzene. Among these solvents, solvents having a specific permittivity in the range of 2 to 5 and preferably in the range of 2.1 to 4.5 and mixed solvents prepared by mixing two or more solvents in a manner such that the specific permittivity is within the above range are preferable. The specific permittivity of a solvent is disclosed in "Organic Solvent", the second edition, John A. Riddick and Emory E. Toops, Jr., 1955.

When the polymerization is conducted in a solvent, it is preferable that the concentration of the polymerizable monomer is 1 to 50% by weight, more preferably 2 to 45% by weight and most preferably 5 to 40% by weight. When the concentration of the polymerizable monomer is smaller than 1% by weight, productivity of the polymer is occasionally poor. When the concentration exceeds 50% by weight, viscosity after the copolymerization is excessively great, and the hydrogenation after the polymerization is occasionally slow.

The amount of the polymerization catalyst expressed as the ratio of the amount by mole of the ruthenium metal to the amount by mole of the alicyclic olefin monomer in the polymerization catalyst (ruthenium metal:monomer) is 1:100 to 1:2,000,000, preferably 1:500 to 1:1,000,000 and more preferably 1:1,000 to 1:500,000. When the amount of the catalyst exceeds the amount expressed by 1:100, removal of the catalyst occasionally becomes difficult. When the amount of the catalyst is less than the amount expressed by 1:2,000,000, the sufficient copolymerization activity is not obtained, occasionally. The temperature of the polymerization is not particularly limited. The temperature of the polymerization is, in general, −100 to 200° C., preferably −50 to 180° C., more preferably −30 to 160° C. and most preferably 0 to 140° C. The time of the polymerization is, in general, 1 minute to 100 hours. The time of the polymerization can be adjusted in accordance with the progress of the polymerization.

The hydrogenation is the reaction to convert the unsaturated double bonds in the main chain of the ring-opening polymer into saturated single bonds, in general, by introducing hydrogen in the presence of a hydrogenation catalyst.

As the hydrogenation catalyst used for the hydrogenation, a catalyst conventionally used for hydrogenation of olefin compounds can be used.

Examples of the hydrogenation catalyst include Ziegler catalysts which are combinations of transition metals and alkali metal compounds such as combinations of cobalt acetate and triethylaluminum, nickel acetylacetonate and triisobutylaluminum, titanocene dichloride and n-butyllithium, zirconocene dichloride and sec-butyllithium and tetrabutoxy titanate and dimethylmagnesium; homogeneous catalysts including noble metal complex catalysts such as organoruthenium compounds represented by the above general formula (2), chlorotris-(triphenylphosphine)rhodium and ruthenium compounds described in Japanese Patent Application Laid-Open Nos. Heisei 7 (1995)-2929, Heisei 7 (1995)-149823, Heisei 11 (1999)-209460, Heisei 11(199)-158256 and Heisei 11 (1999)-193323 and heterogeneous catalysts containing a metal such as nickel, palladium, platinum, rhodium and ruthenium supported on a support such as carbon, silica, diatomaceous earth, alumina and titanium oxide. Specific examples of the hydrogenation catalyst include nickel/silica, nickel/diatomaceous earth, nickel/alumina, palladium/carbon, palladium/silica, palladium/diatomaceous earth, palladium/alumina, ruthenium/silica, ruthenium/alumina, ruthenium/carbon, platinum/silica, platinum/alumina, rhodium/alumina and rhodium/carbon.

Since the carbon-carbon double bond can be hydrogenated selectively without side reactions such as modification of functional groups, the noble metal complex catalysts having a noble metal such as rhodium and ruthenium are preferable, and ruthenium catalysts in which compounds exhibiting a great electron-donating property such as heterocyclic carbene compounds having nitrogen atom and phosphines are coordinated are more preferable, among the above hydrogenation catalysts.

Since the ruthenium catalyst works also as the polymerization catalyst as described above, the hydrogenation can be conducted successively after the ring-opening polymerization. In this case, the activity of the ruthenium catalyst can be enhanced by adding a catalyst modifier. Examples of the catalyst modifier include vinyl compounds such as ethyl vinyl ether and α-olefins.

The hydrogenation is, in general, conducted in an organic solvent. The organic solvent can be suitably selected in accordance with the solubility of the formed hydrogenation product. The same solvent as that used in the polymerization described above may be used. Therefore, after the polymerization has been completed, the hydrogenation can be conducted by adding the hydrogenation catalyst to the reaction mixture without replacing the solvent with another solvent.

The preferable condition for the hydrogenation is different depending on the used hydrogenation catalyst. It is preferable that the condition is selected in a range such that unsaturated bonds other than the C=C double bond formed from the alicyclic olefin monomer are not hydrogenated. From this standpoint, the temperature of the reaction is, in general, −20 to 250° C., preferably −10 to 220° C. and more preferably 0 to 200° C. The pressure of hydrogen is, in general, 0.01 to 10 MPa, preferably 0.05 to 8 MPa and more preferably 0.1 to 5 MPa. When the temperature of the reaction is lower than −20° C., the rate of the reaction is small. When the temperature of the reaction exceeds 250° C., side reactions tend to take place. When the pressure of hydrogen is smaller than 0.01 MPa, the rate of hydrogenation is small. When the pressure of hydrogen exceeds 10 MPa, a reaction apparatus resistant to a high pressure is necessary. The time of the hydrogenation is suitably selected to control the degree of hydrogenation. When the time of the hydrogenation is in the range of 0.1 to 50 hours, 50% or more, preferably 70% or more, more preferably 80% or more and most preferably 90% or more of the carbon-carbon double bonds in the main chain of the copolymer can be hydrogenated.

The weight-average molecular weight of the alicyclic olefin resin of component (A) is, in general, 500 to 20,000, preferably 1,000 to 15,000 and more preferably 2,000 to 10,000.

Examples of the polymerizable monomer used as the material for the alicyclic olefin resin of component (A) are shown in the following.

Examples of the alicyclic olefin monomer which is the polymerizable monomer having an acidic group used in the present invention include the compounds represented by formula (1) shown above.

Examples of the compound represented by formula (1) include 8-hydroxycarbonyltetracyclo[4.4.0.1$^{2,5}$.1$^{7,10}$]dodeca-3-ene, 5-hydroxycarbonylbicyclo[2.2.1]hept-2-ene, 5,6-dihydroxycarbonylbicyclo-[2.2.1]hept-2-ene, 5-methyl-5-hydroxycarbonylbicyclo[2.2.1]hept-2-ene, 5-carboxymethyl-5-hydroxycarbonylbicyclo[2.2.1]hept-2-ene, 8,9-dihydroxycarbonyltetracyclo[4.4.0.1$^{2,5}$.1$^{7,10}$]dodeca-3-ene, 8-methyl-8-hydroxycarbonyltetracyclo[4.4.0.1$^{2,5}$.1$^{7,10}$]dodeca-3-ene, 8-methyl-8,9-dihydroxycarbonyltetracyclo[4.4.0.1$^{2,5}$.1$^{7,10}$]dodeca-3-ene, 8-carboxy-methyl-8-hydroxycarbonyltetracyclo[4.4.0.1$^{2,5}$.1$^{7,10}$]dodeca-3-ene, 11-hydroxycarbonylhexacyclo[6.6.1.1$^{3,6}$.1$^{10,13}$.0$^{2,7}$.0$^{9,14}$]heptadeca-4-ene, 11,12-dihydroxycarbonylhexacyclo[6.6.1.1$^{3,6}$.1$^{10,13}$.0$^{2,7}$.0$^{9,14}$]heptadeca-4-ene, 11-methyl-11-hydroxycarbonylhexacyclo[6.6.1.1$^{3,6}$.1$^{10,13}$.0$^{2,7}$.0$^{9,14}$]-heptadeca-4-ene and 11-carboxymethyl-11-hydroxycarbonylhexacyclo-[6.6.1.1$^{3,6}$.1$^{10,13}$.0$^{2,7}$.0$^{9,14}$] heptadeca-4-ene.

Examples of the other monomer include the following compounds.

Examples of the alicyclic olefin monomer having a group having an aromatic group and an aprotic polar group include monomers in which an aprotic polar group is directly bonded to a group having an aromatic ring such as N-(4-phenyl)-(5-norbornene-2,3-dicarboxyimide), N-(4-phenyl)(5-norbornene-2,3-dicarboxyimide), 2-(4-methoxyphenyl)-5-norbornene, 2-(4-methoxyphenyl)-5-norbornene and 2-benzyloxycarbonyl-5-norbornene.

Examples of the monomer providing a monomer unit derived from an alicyclic olefin monomer having no polar groups include bicyclo[2.2.1]-hept-2-ene [also known as (a.k.a.) norbornene], 5-ethylbicyclo[2.2.1]hept-2-ene, 5-butylbicyclo[2.2.1]hept-2-ene, 5-ethylidenebicyclo[2.2.1]hept-2-ene, 5-methylidenebicyclo[2.2.1]hept-2-ene, 5-vinylbicyclo[2.2.1]hept-2-ene, tricyclo[4.3.0.1$^{2,5}$]deca-3,7-diene (a.k.a. dicyclopentadiene), tetracyclo-[7.4.0.1$^{10,13}$.0$^{2,7}$] trideca-2,4,6,11-tetraene (a.k.a. 1,4-methano-1,4,4a,9a-tetrahydrofluorene), tetracyclo[8.4.0.1$^{11,14}$.0$^{2,8}$]tetradeca-3,5,7,12-11-tetraene, tetracyclo[4.4.0.1$^{2,5}$.1$^{7,10}$]deca-3-ene (a.k.a. tetracyclododecene), 8-methyltetracyclo[4.4.0.1$^{2,5}$.1$^{7,10}$]dodeca-3-ene, 8-ethyltetracyclo-[4.4.0.1$^{2,5}$.1$^{7,10}$]dodeca-3-ene, 8-methylidenetetracyclo[4.4.0.1$^{2,5}$.1$^{7,10}$]-dodeca-3-ene, 8-ethylidenetetracyclo[4.4.0.1$^{2,5}$.1$^{7,10}$]dodeca-3-ene, 8-vinyl-tetracyclo[4.4.0.1$^{2,5}$.1$^{7,10}$]dodeca-3-ene, 8-propenyltetracyclo-[4.4.0.1$^{2,5}$.1$^{7,10}$]dodeca-3-ene, pentacyclo-[6.5.1.1$^{3,6}$.0$^{2,7}$.0$^{9,13}$]pentadeca-3,10-diene, pentacyclo [7.4.0.1$^{3,6}$.1$^{10,13}$.0$^{2,7}$]pentadeca-4,11-diene, cyclobutene, cyclopentene, cyclohexene, 3,4-dimthylcyclopentene, 3-methylcyclohexene, 2-(2-methylbutyl)-1-cyclohexene, cyclooctene, 3a,5,6,7a-tetrahydro-4,7-methano-1H-indene, cycloheptene, vinyl-cyclohexene, vinylcyclohexane, cyclopentadiene, cyclohexadiene, 5-phenylbicyclo[2.2.1]hept-2-ene, 1,4-methano-1,4,4a,5,10,10a-hexahydro-anthracene, 5-phenylbicyclo[2.2.1]hept-2-ene, tetracyclo[6.6.0.1$^{2,5}$.1$^{8,13}$]-tetradeca-3,10,12tetraene and 8-phenyltetracyclo [4.4.0.1$^{2,5}$.1$^{7,10}$]dodeca-3-ene.

As the alicyclic olefin monomer having no aromatic groups but having an aprotic polar group, 8-methyl-8-methoxycarbonyltetracyclo-[4.4.0.1$^{2,5}$.1$^{7,10}$]dodeca-3-ene, bicyclo [2.2.1]hept-2-ene-5,6-dicarboxylic acid anhydride, tetracyclo[4.4.0.1$^{2,5}$.1$^{7,10}$]dodeca-3-ene-8,9-dicarboxylic acid anhydride, hexacyclo[6.6.1.1$^{3,6}$.1$^{10,13}$.0$^{2,7}$.0$^{9,14}$]heptadeca-4-ene-11,12-dicarboxylic acid anhydride, 5-methoxycarbonylbicyclo[2.2.1]hept-2-ene, 5-cyanobicyclo[2.2.1]hept-2-ene and 5-methyl-5-methoxycarbonyl-bicyclo[2.2.1]hept-2-ene can be used.

As the monomer which is not alicyclic, unsaturated hydrocarbons can be used. Examples of the unsaturated hydrocarbons include ethylene and α-olefins having 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene and 1-eicosene; and non-conjugated dienes such as 1,4-hexadiene, 4-methyl-1,4-hexadiene, 5-methyl-1,4-hexadiene and 1,7-octadiene. It is known that, among the above compounds, the α-olefin compounds such as 1-hexene and 1-octene and the diene compounds work also as the molecular weight modifier in the ring-opening polymerization when these compounds are added in an amount of 0.1 to 10% by mole based on the amount of the entire monomers.

The acid-generating agent of component (B) used in the present invention is a compound generating an acid by irradiation with an active radiation.

Examples of the acid-generating agent providing a pattern of the positive-type include quinonediazidesulfonic acid esters. The quinonediazidesulfonic acid ester is an ester compound which is widely used as the photosensitive agent and obtained from a quinonediazidesulfonic acid halide such as 1,2-naphthoquinonediazide-5-sulfonic acid chloride and a phenol having at least one phenolic hydroxyl group. Examples of the phenol include 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl)ethane, 1,1,2,2-tetrakis(4-hydroxyphenyl)ethane, 1,1,3-tris(2,5-dimethyl-4-hydroxyphenyl)-3-phenylpropane, oligomers of novolak resins and oligomers obtained by copolymerization of phenols and dicyclopentadiene (Japanese Patent No. 3090991).

The amount of the acid-generating agent is, in general, 0.5 to 100 parts by weight, preferably 1 to 50 parts by weight and more preferably 10 to 30 parts by weight per 100 parts by weight of the alicyclic olefin resin. When the amount of the acid-generating agent is excessively small, there is the possibility that the fraction of the residual film and the resolution become poor. When the amount of the acid-generating agent is excessively great, there is the possibility that heat resistance and transmission of light become poor.

In the present invention, the crosslinking agent of component (C) is a compound forming a crosslinked structure between molecules of the crosslinking agent by heating or a compound forming a crosslinked structure between molecules of the alicyclic olefins resin by reaction with the alicyclic olefin resin. Specifically, the crosslinking agents is a compound having two or more reactive groups. As the reactive group, amino group, carboxyl group, hydroxyl group, epoxy group, isocyanate group and vinyl group are preferable.

Examples of the crosslinking agent include aliphatic polyamines such as hexamethylenediamine; aromatic polyamines such as 4,4'-diaminodiphenyl ether and diaminodiphenyl sulfone; azide compounds such as 2,6-bis(4'-azidobenzal)cyclohexanone and 4,4'-diazidodiphenyl sulfone; polyamides such as nylon, polyhexamethylenediamine terephthalamide and polyhexamethylene isophthalamide; melamines such as N,N,N',N',N'',N''-(hexaalkoxy methyl) melamines; glycol uryls N,N',N',N'''-(tetraalkoxymethyl) glycol uryls; acrylate compounds such as ethylene glycol di(meth)acrylate and epoxyacrylate resins; isocyanate-based compounds such as hexamethylene diisocyanate-based polyisocyanates, isophorone diisocyanate-based polyisocyanates, and tolylene diisocyanate-based polyisocyanates; hydrogenated diphenylmethane diisocyanate-based polyisocyanates; 1,4-di(hydroxymethyl)cyclohexane; 1,4-di(hydroxymethyl) norbornane; 1,3,4-trihydroxycyclohexane; and epoxy compounds and resins having an alicyclic structure.

The amount of the crosslinking agent is not particularly limited and can be decided as desired taking the degree of heat resistance required for the pattern into consideration. The amount of the crosslinking agent is, in general, 1 to 100 parts by weight, preferably 5 to 80 parts by weight, more preferably 10 to 70 parts by weight and most preferably 20 to 50 parts by weight per 100 parts by weight of the alicyclic olefin resin. The heat resistance tends to decrease when the amount is less than the above range or exceeds the above range.

In the present invention, a solvent dissolving the components described above can be used as the solvent of component (D). Examples of the solvent include alcohols such as methanol, ethanol, propanol, butanol and 3-methoxy-3-methylbutanol; cyclic ethers such as tetrahydrofuran and dioxane; cellosolve esters such as methylcellosolve acetate and ethylcellosolve acetate; glycol ethers such as ethylene glycol monoethyl ether, ethylene glycol monopropyl ether, ethylene glycol mono-t-butyl ether, propylene glycol monoethyl ether, propylene glycol monopropyl ether, propylene glycol monobutyl ether, diethylene glycol monomethyl ether, diethylene glycol monoethyl ether and dipropylene glycol monomethyl ether; propylene glycol alkyl ether acetates such as propylene glycol propyl ether acetate; aromatic hydrocarbons such as benzene, toluene and xylene; ketones such as methyl ethyl ketone, cyclohexanone, 2-heptanone and 4-hydroxy-4-methyl-2-pentanone; esters such as ethyl 2-hydroxypropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methoxypropionate, ethyl 3-ethoxy-propionate, methyl 3-ethoxypropionate, ethyl acetate, butyl acetate and ethyl lactate; and aprotic polar solvents such as N-methylformamide, N,N-dimethylformamide, N-methyl-2-pyrrolidone, N-methylacetamide, N,N-dimethylacetamide, dimethyl sulfoxide and γ-butyrolactone.

To prevent formation of striation (traces formed by coating) and improve the property for development, the radiation sensitive resin composition of the present invention may further comprise various types of surfactants. Examples of the surfactant include nonionic surfactants such as polyoxyethylene lauryl ether and polyoxyethylene dilaurate; fluorine-based surfactants such as surfactants of the EFTOP series manufactured by SHIN AKITA KASEI Co., Ltd., surfactants of the MEGAFACK series manufactured by DAINIPPON INK AND CHEMICALS INCORPORATED, surfactants of the FLUORAD series manufactured by SUMITOMO 3M LIMITED. and surfactants of the ASAHI GUARD series manufactured by ASAHI GLASS Co., Ltd.; silane-based surfactants of the organosiloxane polymer KP series manufactured by SHIN-ETSU CHEMICAL Co., Ltd.; and acrylic acid copolymer-based surfactants of the POLYFLOW series manufactured by KYOEISHA CHEMICAL Co., Ltd. The surfactant is used, where necessary, in an amount, in general, 2 parts by weight or less and preferably 1 part by weight or less based on 100 parts by weight of the solid components in the radiation sensitive resin composition.

The radiation sensitive resin composition of the present invention may further comprise functional silane coupling agents such as γ-glycidoxypropyltrimethoxysilane as the auxiliary adhesive to improve adhesion with the substrate. The amount of the auxiliary adhesive is, in general, 20 parts by weight or less, preferably 0.05 to 10 parts by weight and more preferably 1 to 10 parts by weight per 100 parts by weight of the alicyclic olefin resin.

The radiation sensitive resin composition of the present invention may further comprise antistatic agents, storage stabilizers, defoaming agents, pigments, dyes, antioxidants and sensitizers, where necessary.

The components described above may each be used singly or as a combination of two or more.

The radiation sensitive resin composition of the present invention is a solution obtained by mixing the above components in accordance with a conventional process. The concentration of solid components in the radiation sensitive resin composition of the present invention can be set at a desired value taking the required thickness of the resin film into consideration. In general, the concentration is 5 to 40% by weight from the standpoint of the operability.

It is preferable that the prepared radiation sensitive resin composition is used after foreign substances are removed with a filter of about 0.1 to 5 µm.

The radiation sensitive resin composition of the present invention can be advantageously used as the material for various resin pattern film for electronic parts, examples of which include protective films for devices such as display devices and integrated circuit devices and color filters for liquid crystal displays, flattening films for flattening the surface of devices and wiring, insulation films for maintaining electric insulation (including interlayer insulation films and solder resist films which are the electric insulation films in liquid crystal display devices of the thin transistor type and integrated circuit devices).

A resin pattern film is formed on a substrate by laminating the resin film comprising the radiation sensitive resin composition of the present invention described above to the substrate, irradiating the resin film with an active radiation through a mask pattern to form a latent pattern in the resin film and developing a resin pattern by bringing the resin film having the latent pattern into contact with a developing solution.

The process for laminating the resin film to the substrate is not particularly limited. For example, the surface of a substrate is coated with the radiation sensitive resin composition of the present invention, and the formed coating layer is dried to form a resin film having no fluidity on the substrate.

As the process for coating the surface of a substrate or a support with the radiation sensitive resin composition of the present invention, various processes such as the spray coating process, the roll coating process and rotation coating process can be used. The formed coating layer is dried by heating, and a resin film having no fluidity can be obtained. When the resin film is formed directly on the surface of the substrate, the condition of heating is, in general, at 60 to 120° C. for about 10 to 600 seconds although the condition is different depending on the types and the relative amounts of the components. In the process in which the coating film is formed directly on the substrate by coating the surface of the substrate with the radiation sensitive resin composition, followed by drying the formed coating layer, the heating for the drying is called, in general, the "prebaking".

The obtained resin film is irradiated with an active radiation, and a latent pattern is formed in the resin film. The type of the active radiation is not particularly limited. Examples of the active radiation include visible light, ultraviolet light, far ultraviolet light, X-ray, electron beams and proton beams. Among these radiations, visible light and ultraviolet light are preferable. The amount of radiation applied by the irradiation can be set as desired in accordance with the type and the thickness of the resin film. The pattern may be formed by irradiation through a mask having the pattern or by directly drawing the pattern with electron beams.

The developing solution is an aqueous solution obtained by dissolving an alkaline compound into water. Examples of the alkaline compound include inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-propylamine; tertiary amines such as triethylamine, methyldiethylamine and N-methylpyrrolidone; alcohol amines such as dimethylethanolamine and triethanolamine; quaternary ammonium salts such as tetramethylammonium hydroxide, tetraethylammonium hydroxide, tetrabutylammonium hydroxide and choline; and cyclic amines such as pyrrol, piperidine, 1,8-diazabicyclo[5.4.0]undeca-7-ene and 1.5-diazabicyclo-[4.3.0]nona-5-ene. The alkaline compound may be used singly or as a mixture of two or more.

The time of the development is not particularly limited. The time of the development is, in general, 30 to 180 seconds. The process for bringing the developing solution into contact with the resin film having a latent pattern is not particularly limited. For example, the paddle process, the spray process or the dipping process can be used.

The temperature of the development is not particularly limited. The temperature of the development is, in general, 15 to 35° C. and preferably 20 to 30° C.

After the desired resin pattern film is formed on the substrate as described above, where necessary, the substrate may be brought into contact with a rinsing liquid in accordance with a conventional process to remove unnecessary residues of development remaining on the substrate, the back face of the substrate and end portions of the substrate. After the substrate has been brought into contact with the rinsing liquid, in general, the substrate is dried with the compressed air or a compressed nitrogen gas to remove the rinsing liquid. Where necessary, the entire surface of the substrate having the resin pattern layer may be irradiated with the active radiation.

The resin pattern film formed on the substrate is, where necessary, cured by heating (the "post baking"). From the standpoint of the improvement in the heat resistance of the resin pattern film, it is preferable that the resin pattern film is heated. The process for the heating is not particularly limited. For example, the heating is conducted using a heating apparatus such as a hot plate and an oven. The temperature of the heating is not particularly limited. The temperature of the heating is, in general, 150 to 300° C. and preferably 200 to 250° C. The time of the heating is not particularly limited. For example, the time of the heating is, in general, 5 to 60 minutes when a hot plate is used and 30 to 90 minutes when an oven is used.

The resin pattern film formed by using the radiation sensitive resin composition of the present invention is a transparent resin film exhibiting excellent transparency. The resin pattern film of the present invention can be advantageously used as the resin film for various electronic parts, examples of which include electronic devices such as semiconductor devices, light emitting diodes and various types of memories, coating materials for hybrid IC, MCM and printed circuit boards, interlayer insulation films of multi-layer circuit boards and insulation films for liquid crystal displays.

EXAMPLES

The present invention will be described more specifically with reference to Synthesis Examples and Examples in the following. The part and the percent in the examples show the part by weight and the percent by weight, respectively, unless otherwise mentioned.

Synthesis Example 1

Into a pressure resistant glass reactor which had been purged with nitrogen gas, 100 parts by weight of 8-hydroxycarbonyltetracyclo-[4.4.0.1$^{2,5}$.1$^{7,10}$]dodeca-3-ene, 1.3 parts by weight of 1-hexene, 0.05 parts by weight of 1,3-dimesitylimidazolidin-2-ylidene)(tricyclohexylphosphine)benzylideneruthenium dichloride and 400 parts by weight of tetrahydrofuran were placed. The resultant mixture was stirred for 2 hours under heating at 70° C., and a reaction solution was obtained. It was confirmed in accordance with the gas chromatography that the monomers did not remain in the reaction solution. The obtained reaction solution was poured into a great amount of n-hexane, and the solid component was separated. The obtained solid component was washed with n-hexane and dried at 100° C. for 18 hours under a reduced pressure, and a ring-opening metathesis copolymer was obtained as a white solid. Into an autoclave equipped with a stirrer, 100 parts by weight of the ring-opening metathesis copolymer, 400 parts by weight of tetrahydrofuran and 5 parts by weight of palladium/carbon (10% palladium) as the hydrogenation catalyst were placed, and hydrogenation was conducted under a hydrogen pressure of 1.0 MPa at 60° C. for 8 hours. After the reaction mixture was filtered, the reaction product was coagulated in a great amount of n-hexane and dried in a manner similar to that conducted above, and Polymer A which was an alicyclic olefin resin having carboxyl group was obtained. It was confirmed from the $^1$H-NMR spectrum that the degree of hydrogenation of the polymer was 100%, and the entire amount of carboxyl group was remaining. The degree of hydrogenation is the value based on the amount of the aliphatic C=C bond formed from the alicyclic olefin monomer by the ring-opening polymerization.

Synthesis Example 2

In accordance with the same procedures as those conducted in Synthesis Example 1 except that 100 parts by weight of a mixture of 8-hydroxycarbonyltetracyclo[4.4.0.1$^{2,5}$.1$^{7,10}$]dodeca-3-ene and bicyclo-[2.2.1]hept-2-ene (80/20 as the ratio of the amounts by mole) was used in place of 8-hydroxycarbonyltetracyclo[4.4.0.1$^{2,5}$.1$^{7,10}$]dodeca-3-ene, Polymer B which was an alicyclic olefin resin having carboxyl group was obtained. It was confirmed from the $^1$H-NMR spectrum that the degree of hydrogenation of the polymer was 100%, and the entire amount of carboxyl group was remaining.

Synthesis Example 3

In accordance with the same procedures as those conducted in Synthesis Example 1 except that 100 parts by weight of a mixture of 8-hydroxycarbonyltetracyclo[4.4.0.1$^{2,5}$.1$^{7,10}$]dodeca-3-ene and 8-methyl-8-methoxycarbonyltetracyclo[4.4.0.1$^{2,5}$.1$^{7,10}$]dodeca-3-ene (95/5 as the ratio of the amounts by mole) was used in place of 8-hydroxycarbonyltetracyclo[4.4.0.1$^{2,5}$.1$^{7,10}$]dodeca-3-ene, Polymer C which was an alicyclic olefin resin having an acidic group was obtained. It was confirmed from the $^1$H-NMR spectrum that the degree of hydrogenation of the polymer was 100%, and the entire amount of carboxyl group was remaining.

Synthesis Example 4

In accordance with the same procedures as those conducted in Synthesis Example 1 except that 100 parts by weight of a mixture of 8-hydroxycarbonyltetracyclo[4.4.0.1$^{2,5}$.1$^{7,10}$]dodeca-3-ene, 8-methyl-8-methoxycarbonyltetracyclo[4.4.0.1$^{2,5}$.1$^{7,10}$]dodeca-3-ene and bicyclo[2.2.1]-hept-2-ene (78/2/20 as the ratio of the amounts by mole) was used in place of 8-hydroxycarbonyltetracyclo[4.4.0.1$^{2,5}$.1$^{7,10}$]dodeca-3-ene, Polymer D which was an alicyclic olefin resin having an acidic group was obtained. It was confirmed from the $^1$H-NMR spectrum that the degree of hydrogenation of the polymer was 100%, and the entire amounts of carboxyl group and ester group were remaining.

Comparative Synthesis Example 1

In accordance with the polymerization process using a tungsten catalyst which was disclosed in Synthesis Example 1 of Japanese Patent Application Laid-Open No. Heisei 10 (1998)-307388, the ring-opening polymerization of 8-methyl-8-methoxycarbonyltetracyclo-[4.4.0.1$^{2,5}$.1$^{7,10}$]-dodeca-3-ene was conducted, and a ring-opening polymer having a weight-average molecular weight of 16,800 was obtained. The conversion of the polymerization was about 100%. After the obtained ring-opening polymer was hydrogenated, the product of the hydrogenation was hydrolyzed at 190° C. for 4.5 hours, and an alicyclic olefin resin having a polar group (Polymer E) was obtained. The degree of hydrogenation was 100%, and the degree of hydrolysis was 95%.

Comparative Synthesis Example 2

In accordance with the same procedures as those conducted in Synthesis Example 1 except that 100 parts by weight of a mixture of 8-methyl-8-methoxycarbonyltetracyclo[4.4.0.1$^{2,5}$.1$^{7,10}$]dodeca-3-ene and 5-methyl-5-methoxycarbonylbicyclo[2.2.1]hept-2-ene (80/20 as the ratio of the amounts by mole) was used in place of 8-hydroxycarbonyltetracyclo-[4.4.0.1$^{2,5}$.1$^{7,10}$]dodeca-3-ene, the ring-opening polymerization and the hydrogenation were conducted. Then, the hydrolysis was conducted in accordance with the same procedure as that conducted in Comparative Synthesis Example 1, and an alicyclic olefin resin having a polar group (Polymer F) was obtained. The degree of hydrogenation was 100%, and the degree of hydrolysis was 97%.

The mole fractions of carboxyl group and methyloxycarbonyl group in the obtained polymers are shown in Table 1.

TABLE 1

| Polymer | Carboxyl group | Methyloxycarbonyl group |
|---|---|---|
| A | 100% | 0% |
| B | 80% | 0% |
| C | 95% | 5% |
| D | 78% | 2% |
| E | 95% | 5% |
| F | 78% | 2% |

Example 1

The alicyclic olefin resin obtained in Synthesis Example 1 (Polymer A) in an amount of 100 parts by weight, 550 parts by weight of cyclohexanone as the solvent, 20 parts by weight of a condensate of 1,1,3-tris(2,5-dimethyl-4-hydroxyphenyl)-3-phenyl propane (1 mole) and 1,2-naphthoquinonediazide-5-sulfonic acid chloride (1.9 moles) as the acid-generating agent, 25 parts by weight of CYMEL 300 as the crosslinking agent, 5 parts by weight of γ-glycidoxypropyltrimethoxysilane as the auxiliary adhesive and 0.05 parts by weight of MEGAFACK F172 (manufactured by DAINIPPON INK AND CHEMICALS INCORPORATED) as the surfactant were mixed, and a solution was prepared. The prepared solution was filtered through a Millipore filter having a pore size of 0.45 μm, and a solution of a radiation sensitive resin composition was prepared. The prepared solution was applied to a silicon substrate, a glass substrate and a substrate having a silicon oxide film with a step of 1 μm (this substrate will be referred to as a stepped substrate) in accordance with the spin coating process. The coated substrates were prebaked on a hot plate at 90° C. for 2 minutes, and coating films having a thickness of 3.0 μm were formed. Masks having prescribed patterns were placed on the silicon substrate, the glass substrate and the stepped substrate, and ultraviolet light having a wavelength of 365 nm and an intensity of 5 mW/cm$^2$ was applied for 40 seconds under the atmosphere of the air. Then, the development was conducted at 25° C. for 60 seconds using a 0.3% aqueous solution of tetramethylammonium. Then, rinsing with ultra-pure water was conducted for 1 minute, and thin films having patterns of the positive type were formed. Then, the entire faces were irradiated with ultraviolet light having a wavelength of 365 nm and an intensity of 5 mW/cm$^2$ for 60 seconds. The silicon substrate, the glass substrate and the substrate having a silicon oxide film with a step of 1 μm on which the patterns were formed, were heated on a hot plate at 200° C. for 30 minutes for post baking of the pattern film and the coating film, and a silicon substrate, a glass substrate and a stepped substrate on which thin pattern films were formed were obtained.

Examples 2 to 4

In accordance with the same procedures as those conducted in Example 1 except that Polymer B to D were used in place of Polymer A, a silicon substrate, a glass substrate and a stepped substrate having thin pattern films were obtained.

Comparative Examples 1 and 2

In accordance with the same procedures as those conducted in Example 1 except that Polymer E (Comparative Example 1) and F (Comparative Example 2) were used in place of Polymer A, a silicon substrate, a glass substrate and a stepped substrate having thin pattern films were obtained.

The silicon substrates obtained in Examples and Comparative Examples each had a specific permittivity (ε) smaller than 2.85 as measured at 10 kHz (at the room temperature) in accordance with the method of Japanese Industrial Standard C6481. After the substrates were heated in an oven at 220° C. for 60 minutes, the substrates each had a thickness which was 95% or greater of the thickness before being heated. Thus, it was confirmed that the silicon substrates having the thin pattern film exhibited excellent specific permittivity and dimensional stability under heating. The glass substrates obtained in Examples and Comparative Examples each had a minimum transmittance of light (t) of 90% or greater as measured at a wavelength of 400 to 800 nm using a spectrophotometer for ultraviolet, visible and near infrared light (V-570) manufactured by JASCO CORPORATION; a difference between the minimum transmittance of light (t') and the minimum transmittance of light (t) smaller than 5%, wherein the minimum transmittance of light (t') was measured after being heated in an oven at 220° C. for 60 minutes in accordance with the same method as that described above and the minimum transmittance of light (t) was measured before being heated; and a change in the thickness (S) after being dipped into dimethyl sulfoxide at 70° C. for 30 minutes smaller than 10%. Thus, it was confirmed that the transparency, the resistance to discoloration under heating and the solvent resistance of the coated glass substrates were excellent. Using the stepped substrates having the thin pattern film was formed, the size of the step was measured by a thickness meter of the contact type, and the size of the step was smaller than 0.1 μm in all cases. Thus, it was confirmed that the flatness was excellent.

In addition to the above evaluations, the property for development and the storage stability of the resin (Polymers A to F) used in Examples and Comparative Examples were evaluated in accordance with the following methods. The results are shown in Table 2.

(1) Property for Development

With respect to a resist pattern of the positive type formed on a silicon substrate, the scum after the development and the degree of incomplete development were evaluated by observation by a scanning electron microscope. When no scum after the development or incomplete development was found, the result is expressed as "good". When the scum after the development was found although no incomplete development was found, the result is expressed as "scum formed". When the incomplete development was found although no scum after the development was found, the result is expressed as "incomplete development found". When the scum after the development and the incomplete development were found, the result is expressed as "poor".

(2) Storage Stability

The radiation sensitive resin compositions prepared in Examples were each placed into a glass ampoule and tightly sealed. After the ampoules were left standing at the room temperature for 1 week, the solutions were examined by visual observation. When no change was found, the result is expressed as "good". When the viscosity increased slightly and the solution was slightly turbid, the result is expressed as "fair". When the content turned into white gel, the result is expressed as "poor".

TABLE 2

|  | Property for development | Storage stability |
|---|---|---|
| Example 1 | good | good |
| Example 2 | good | good |
| Example 3 | good | good |
| Example 4 | good | good |
| Comparative Example 1 | scum formed | poor |
| Comparative Example 2 | poor | poor |

It is shown from the above results that the compounds obtained by polymerization of the polymerizable monomers containing the alicyclic olefin monomer having carboxyl group in the presence of the ruthenium catalyst, followed by hydrogenation of the obtained polymers surely provided the excellent property for development and storage stability while the excellent balance between the specific permittivity, the transparency, the dimensional stability under heating, the solvent resistance and the flatness was maintained (Examples 1 to 4). In contrast, it is shown that the property for development and the storage stability were poor when the alicyclic olefin resin obtained by ring-opening polymerization of the alicyclic olefin monomer having an alkyloxycarbonyl group in the presence of the tungsten catalyst, followed by hydrogenation of the obtained polymer and hydrolysis of the obtained polymer to convert into carboxyl group as described in Japanese Patent Application Laid-Open No. Heisei 10(1988)307388 was used (Comparative Example 1). It is also shown that the property for development and the storage stability deteriorated when the acidic group was formed by hydrolysis even when the resin was obtained by the ring-opening polymerization and the hydrogenation in the presence of the ruthenium catalyst (Comparative Example 2).

INDUSTRIAL APPLICABILITY

In accordance with the present invention, the radiation sensitive resin composition which exhibits not only the excellent specific permittivity, transparency, dimensional stability under heating, solvent resistance and flatness but also the excellent property for development and storage stability can be obtained. Since the resin film obtained using the composition exhibits excellent transparency, the transparent resin pattern film which exhibits excellent transparency and used as the resin film for electronic parts such as the electronic part for liquid crystal display devices, integrated circuit devices and solid image forming devices, the color filter for liquid crystal displays, the protective film, the flattening film and the electric insulation film, can be provided.

The invention claimed is:

1. A radiation sensitive resin composition which is capable of forming a positive pattern resin film which comprises (A) an alicyclic olefin resin soluble in an alkali, (B) an acid-generating agent, (C) a crosslinking agent and (D) a solvent, wherein the alicyclic resin soluble in an alkali is a ring-opening polymer having an acidic group which is obtained by ring-opening polymerization of a polymerizable monomer comprising an alicyclic olefin monomer having an acidic group in a presence of a catalyst comprising ruthenium, followed by hydrogenating an obtained polymer,
   wherein the catalyst comprising ruthenium is a catalyst comprising as a main component an organoruthenium compound in which a neutral electron-donating ligand is coordinated,
   wherein said crosslinking agent is a compound capable of forming a crosslinked structure between molecules of the crosslinking agent by heating,
   wherein the acidic group is a carboxyl group, and
   wherein the alicyclic olefin monomer having an acidic group is an alicyclic olefin monomer selected from the group consisting of 8-hydroxycarbonyltetracyclo[4.4.0.1$^{2,5}$.1$^{7,10}$]dodeca-3-ene, 5-hydroxycarbonylbicyclo[2.2.1]hept-2-ene, 5,6-dihydroxycarbonylbicyclo[2.2.1]hept-2-ene, 5-methyl-5-hydroxycarbonylbicyclo[2.2.1]hept-2-ene, 5-carboxymethyl-5-hydroxycarbonylbicyclo2.2.1]hept-2-ene, 8,9-dihydroxycarbonyltetracyclo[4.4.0.1$^{2,5}$.1$^{7,10}$]dodeca-3-ene, 8-methyl-8-hydroxycarbonyltetracyclo[4.4.0.1$^{2,5}$.1$^{7,10}$]dodeca-3-ene, 8-methyl-8,9-dihydroxycarbonyltetracyclo[4.4.0.1$^{2,5}$.1$^{7,10}$]dodeca-3-ene, 8-carboxy-methyl-8-hydroxycarbonyltetracyclo[4.4.0.1$^{2,5}$.1$^{7,10}$]dodeca-3-ene, 11-hydroxycarbonylhexacyclo[6.6.1.1$^{3,6}$.1$^{10,13}$.0$^{2,7}$.0$^{9,14}$]heptadeca-4-ene, 11,12-dihydroxycarbonylhexacyclo[6.6.1.1$^{3,6}$.1$^{10,13}$.0$^{2,7}$.0$^{9,14}$]heptadeca-4-ene, 11-methyl-11-hydroxycarbonylhexacyclo heptadeca-4-ene and 11-carboxymethyl-11-hydroxycarbonylhexacyclo-[6.6.1.1$^{3,6}$.1$^{10,13}$.0$^{2,7}$.0$^{9,14}$]heptadeca-4-ene.

2. A radiation sensitive resin composition according to claim 1, wherein the neutral electron-donating ligand is a heterocyclic carbene compound having nitrogen atom.

3. A radiation sensitive resin composition according to claim 1, wherein the polymerizable monomer further comprises an alicyclic olefin monomer in which a group having an aromatic group and an aprotic polar group are bonded.

4. A radiation sensitive resin composition according to claim 1, wherein the acid-generating agent is capable of providing a positive pattern.

5. A radiation sensitive resin composition according to claim 4, wherein the acid-generating agent capable of providing a positive pattern is a quinonediazidesulfonic acid ester obtained from a quinonediazidesulfonic acid halide and a phenol having at least one phenolic hydroxyl group.

6. A radiation sensitive resin composition according to claim 5, wherein the quinonediazidesulfonic acid halide is 1,2-naphthoquinone-diazide-5-sulfonic acid chloride.

7. A radiation sensitive resin composition according to claim 6, wherein the phenol is selected from the group consisting of 2,3,4-trihydroxy-benzophenone, 2,3,4,4'-tetrahydroxybenzophenone, 2-bis(4-hydroxy-phenyl)propane, tris(4-hydroxyphenyl)methane, 1,1,1-tris(4-hydroxy-3-methylphenyl)ethane, 1,1,2,2-tetrakis(4-hydroxyphenyl)ethane, 1,1,3-tris-(2,5-dimethyl-4-hydroxyphenyl)-3-phenylpropane, an oligomer of novolak resins and an oligomer obtained by copolymerization of phenols and dicyclopentadiene.

8. A radiation sensitive resin composition according to claim 1, wherein (C) the crosslinking agent is a compound capable of forming a crosslinked structure between molecules of the crosslinking agent by heating which is selected from the group consisting of an aliphatic polyamine which is hexamethylenediamine; an aromatic polyamine selected from the group consisting of 4,4'-diaminodiphenyl ether and diaminodiphenyl sulfone; an azide compound selected from the group consisting of 2,6-bis(4'-azidobenzal)cyclohexanone and 4,4'-diazidodiphenyl sulfone; a polyamide selected from the group consisting of nylon, polyhexamethylenediamine terephthalamide and polyhexamethylene isophthalamide; a melamine selected from N,N,N',N',N'',N''-(hexaalkoxy methyl)melamines; a glycol uryl selected from N,N',N'',N'''-(tetraalkoxymethyl)glycol uryls; an acrylate compound selected from the group consisting of ethylene glycol di(meth)acrylate and an epoxyacrylate resin; an isocyanate compound selected from the group consisting of a hexamethylene diisocyanate polyisocyanate, an isophorone diisocyanate polyisocyanate, a tolylene diisocyanate polyisocyanate; a hydrogenated diphenylmethane diisocyanate polyisocyanate; 1,4-di(hydroxymethyl)cyclohexane; 1,4-di(hydroxymethyl)norbornane; 1,3,4trihydroxycyclohexane; and an epoxy compound and a resin having an alicyclic structure.

9. A process for forming a positive pattern resin film on a substrate which comprises laminating a resin film comprising a radiation sensitive resin composition which comprises (A) an alicyclic olefin resin soluble in an alkali, (B) an acid-generating agent, (C) a crosslinking agent and (D) a solvent, wherein the alicyclic resin soluble in an alkali is a ring-opening polymer having an acidic group which is obtained by ring-opening polymerization of a polymerizable monomer comprising an alicyclic olefin monomer having an acidic group in a presence of a catalyst comprising ruthenium, followed by hydrogenating an obtained polymer to the substrate, irradiating said resin film with an active radiation to form a latent positive pattern in the resin film and developing the pattern by bringing the resin film having the latent pattern into contact with a developing solution to obtain a developed pattern, and post-baking by heating to cure the obtained pattern,
   wherein the catalyst comprising ruthenium is a catalyst comprising as a main component an organoruthenium compound in which a neutral electron-donating ligand is coordinated,
   wherein said crosslinking agent is a compound capable of forming a crosslinked structure between molecules of the crosslinking agent by heating, and
   wherein the acidic group is a carboxyl group.

10. A process according to claim 9, wherein the alicyclic olefin monomer having an acidic group is an alicyclic olefin monomer represented by following formula (1):

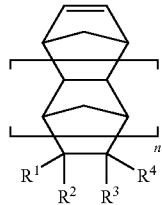

(1)

wherein $R^1$ to $R^4$ each independently represent hydrogen atom or a group represented by —$X_m$—R', X representing a divalent group, m representing 0 or 1, and R' representing an alkyl group having 1 to 7 carbon atoms which may have substituents, an aromatic group or an acidic group; at least one of $R^1$ to $R^4$ represents a group represented by —$X_m$—R' in which R' represents a carboxyl group; and n represents an integer of 0 to 2.

11. A process according to claim 9, wherein the neutral electron-donating ligand is a heterocyclic carbene compound having nitrogen atom.

12. A process according to claim 9, wherein the polymerizable monomer further comprises an alicyclic olefin monomer in which a group having an aromatic group and an aprotic polar group are bonded.

13. A process for forming a resin pattern film according to claim 9, wherein the acid-generating agent is capable of providing a positive pattern.

14. A process for forming a resin pattern film according to claim 13, wherein the acid-generating agent capable of providing a positive pattern is a quinonediazidesulfonic acid ester obtained from a quinonediazidesulfonic acid halide and a phenol having at least one phenolic hydroxyl group.

15. A process for forming a resin pattern film according to claim 14, wherein the quinonediazidesulfonic acid halide is 1,2-naphthoquinone-diazide-5-sulfonic acid chloride.

16. A process for forming a resin pattern film according to claim 15, wherein the phenol is selected from the group consisting of 2,3,4-trihydroxy-benzophenone, 2,3,4,4'-tetrahydroxybenzophenone, 2-bis(4-hydroxy-phenyl)propane, tris(4-hydroxyphenyl)methane, 1,1,1-tris(4-hydroxy-3-methylphenyl)ethane, 1,1,2,2-tetrakis(4-hydroxyphenyl) ethane, 1,1,3-tris-(2,5-dimethyl-4-hydroxyphenyl)-3-phenylpropane, an oligomer of novolak resins and an oligomer obtained by copolymerization of phenols and dicyclopentadiene.

17. A resin film of a positive pattern which is made of a radiation sensitive resin composition which comprises (A) an alicyclic olefin resin soluble in an alkali, (B) an acid-generating agent, (C) a crosslinking agent and (D) a solvent, wherein the alicyclic resin soluble in an alkali is a ring-opening polymer having an acidic group which is obtained by ring-opening polymerization of a polymerizable monomer comprising an alicyclic olefin monomer having an acidic group in a presence of a catalyst comprising ruthenium, followed by hydrogenating an obtained polymer, wherein the catalyst comprising ruthenium is a catalyst comprising as a main component an organoruthenium compound in which a neutral electron-donating ligand is coordinated, wherein said crosslinking agent is a compound capable of forming a crosslinked structure between molecules of the crosslinking agent by heating, and wherein said resin film formed of said resin composition is cured by heating (post baking) after the positive pattern of the resin film is developed, wherein the acidic group is a carboxyl group, and wherein the alicyclic olefin monomer having an acidic group is an alicyclic olefin monomer selected from the group consisting of 8-hydroxycarbonyltetracyclo[4.4.0.1$^{2,5}$.1$^{7,10}$]dodeca-3-ene, 5-hydroxycarbonylbicyclo[2.2.1]hept-2-ene, 5,6-dihydroxycarbonylbicyclo-[2.2.1]hept-2-ene, 5methyl-5-hydroxycarbonylbicyclo[2.2.1]hept-2-ene, 5-carboxymethyl-5-hydroxycarbonylbicyclo[2.2.1]hept-2-ene, 8,9-dihydroxycarbonyltetracyclo[4.4.0.1$^{2,5}$.1$^{7,10}$]dodeca-3-ene, 8-methyl-8-hydroxycarbonyltetracyclo[4.4.0.1$^{2,5}$.1$^{7,10}$]dodeca-3-ene, 8-methyl-8,9-dihydroxycarbonyltetracyclo[4.4.0.1$^{2,5}$.1$^{7,10}$]dodeca-3-ene, 8-carboxy-methyl-8-hydroxycarbonyltetracyclo[4.4.0.1$^{2,5}$.1$^{7,10}$]dodeca-3-ene, 11-hydroxycarbonylhexacyclo[6.6.1.1$^{3,6}$.1$^{10,13}$.0$^{2,7}$.0$^{9,14}$heptadeca-4-ene, 11,12-dihydroxycarbonylhexacyclo[6.6.1.1$^{3,6}$.1$^{10,13}$.0$^{2,7}$.0$^{9,14}$]heptadeca-4-ene, 11-methyl-11-hydroxycarbonylhexacyclo[6.6.1.1$^{3,6}$.1$^{10,13}$.0$^{2,7}$.0$^{9,14}$]-heptadeca-4-ene and 11carboxymethyl-11-hydroxycarbonylhexacyclo-[6.6.1.1$^{3,6}$.1$^{10,13}$.0$^{2,7}$.09,14]heptadeca-4-ene.

\* \* \* \* \*